United States Patent
Dong

(10) Patent No.: US 6,261,976 B1
(45) Date of Patent: Jul. 17, 2001

(54) METHOD OF FORMING LOW PRESSURE SILICON OXYNITRIDE DIELECTRICS HAVING HIGH RELIABILITY

(75) Inventor: Zhong Dong, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/270,590

(22) Filed: Mar. 18, 1999

(51) Int. Cl.[7] ................................................. H01L 21/469
(52) U.S. Cl. ............................................................ 438/786
(58) Field of Search ..................................... 438/769, 770, 438/775, 778, 786

(56) References Cited

U.S. PATENT DOCUMENTS

| | | | |
|---|---|---|---|
| 5,397,720 | 3/1995 | Kwong et al. | 437/40 |
| 5,407,870 | 4/1995 | Okada et al. | 437/241 |
| 5,464,783 | 11/1995 | Kim et al. | 437/42 |
| 5,464,792 | 11/1995 | Tseng et al. | 437/160 |
| 5,726,087 | 3/1998 | Tseng et al. | 438/261 |
| 5,885,870 | * 3/1999 | Maiti et al. | 438/261 |

* cited by examiner

*Primary Examiner*—David Nelms
*Assistant Examiner*—Quoc Hoang
(74) *Attorney, Agent, or Firm*—George O. Saile; Rosemary L. S. Pike

(57) ABSTRACT

A method for improving oxide quality and reliability by using low pressure during oxidation and nitridation is described. The wafer is loaded into a chamber wherein a pressure of between about 80 and 300 torr is maintained during the forming of the dielectric layer. The silicon substrate of the wafer is oxidized, then nitrided. The substrate is annealed to complete formation of the dielectric layer.

20 Claims, 3 Drawing Sheets

METHOD OF FORMING LOW PRESSURE SILICON OXYNITRIDE DIELECTRICS HAVING HIGH RELIABILITY

BACKGROUND OF THE INVENTION (1) Field of the Invention

The invention relates to the fabrication of integrated circuit devices, and more particularly, to a method of improving gate oxide quality and reliability in the fabrication of integrated circuits.

(2) Description of the Prior Art

In the fabrication of integrated circuits, a gate dielectric, typically silicon oxide, is grown on the surface of a monocrystalline silicon semiconductor substrate. A polysilicon layer is deposited overlying the gate oxide layer and patterned to form polysilicon gate electrodes. Upon implanting the gate polysilicon with boron or $BF_2$, boron ions can penetrate the gate oxide layer causing a threshold voltage shift. Nitriding the gate oxide layer can prevent ion penetration. However, nitrogen incorporation into the gate oxide will degrade reliability in terms of charge-to-breakdown value ($Q_{bd}$). It is desired to form a nitrided gate dielectric, such as silicon oxynitride that will not degrade $Q_{bd}$.

Various patents describe methods of forming gate dielectric layers including silicon oxynitride. These include U.S. Pat. No. 5,407,870 to Okada et al, U.S. Pat. No. 5,464,792 to Tseng et al, U.S. Pat. No. 5,397,720 to Kwong et al, U.S. Pat. No. 5,464,783 to Kim et al, and U.S. Pat. No. 5,726,087 to Tseng et al. These patents teach methods of forming the oxynitride layers at atmospheric pressure (stated or implied) except for the patent to Kim et al which deposits silicon oxynitride by chemical vapor deposition (CVD) at 800° C. and a pressure of 13 Pascals, which is 0.1 torr.

SUMMARY OF THE INVENTION

A principal object of the present invention is to provide an effective and very manufacturable method of improving gate oxide quality.

A further object of the invention is to provide a method of improving oxide quality by preventing the penetration of impurities into the gate oxide layer.

Yet another object is to provide a method of improving oxide quality by improving thickness uniformity.

Yet another object is to provide a method of improving gate oxide reliability by improving the charge-to-breakdown value.

A still further object of the invention is to provide a method of improving oxide quality and reliability by using low pressure during oxidation and nitridation.

In accordance with the objects of this invention a method for improving oxide quality and reliability by using low pressure during oxidation and nitridation is achieved. The wafer is loaded into a chamber wherein a pressure of between about 80 and 300 torr is maintained during the forming of the dielectric layer. The silicon substrate of the wafer is oxidized, then nitrided. The substrate is annealed to complete formation of the dielectric layer.

BRIEF DESCRIPTION OF THE DRAWINGS

In the accompanying drawings forming a material part of this description, there is shown.

DESCRIPTION OF THE PREFERRED EMBODIMENTS

Figure 1:
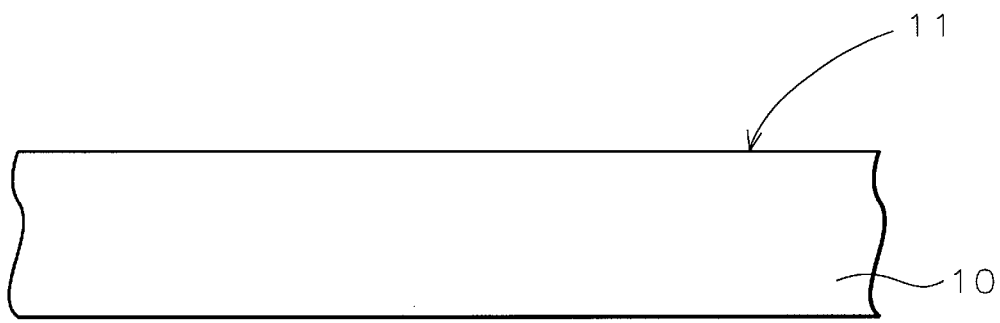
FIGS. 1 and 3 through 5 schematically illustrate in cross-sectional representation a preferred embodiment of the present invention.

Referring now more particularly to FIG. 1, there is shown an illustration of a portion of a partially completed integrated circuit. The semiconductor substrate 10 is preferably composed of silicon having a (100) crystallographic orientation. The surface 11 of the silicon substrate 10 is cleaned, for example by an RCA clean.

Now, the improved gate dielectric of the present invention will be formed. The wafer is loaded into a rapid thermal process chamber. The chamber is pumped down to remove any possible gas impurities. The chamber pressure is reduced to between about 100 and 300 torr, and preferably about 200 torr.

The temperature is ramped up to the preferred temperature of between about 900 and 1100° C., and preferably about 1000° C.

Figure 2:
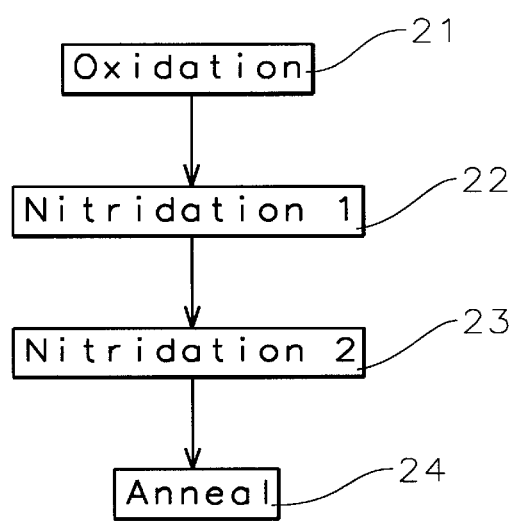
FIG. 2 is a flowchart illustrating the process of forming the improved gate dielectric layer of the present invention.

The gate dielectric is formed using a four-step process. FIG. 2 is a flowchart showing the four-step process. The first step 21 comprises oxidation. $O_2$ gas is flowed at between about 2 and 10 liters/minute for between about 15 and 60 seconds. Step 22 is a first nitridation in which nitrous oxide ($N_2O$) is flowed at 2 to 5 liters/minute for between about 20 and 60 seconds.

Then, the chamber pressure is reduced to between about 80 and 180 torr and preferably about 100 torr. The second nitridation, step 23, also comprises flowing $N_2O$ at 2 to 5 liters/minute, but for between about 60 and 100 seconds and at the reduced pressure of preferably 100 torr.

Finally, in step 24, the pressure is increased to its previous setting of preferably about 200 torr. The wafer is annealed by a flow of $N_2$ gas at 5 to 10 liters/minute for about 20 to 60 seconds.

Figure 3:
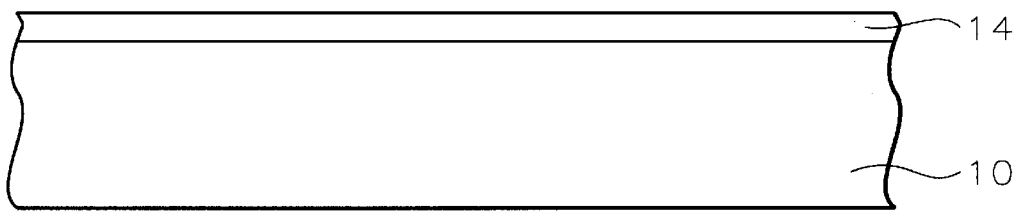

FIG. 3 illustrates the gate dielectric layer 14 formed by the process illustrated in FIG. 2 and described above. The resulting dielectric thickness is between about 25 and 40 Angstroms, and preferably between about 30 and 35 Angstroms.

Although the four-step process is preferred, there are other alternatives that provide satisfactory dielectric layers. The preferred method includes an oxidation step, two nitridation steps at two different low pressure settings, and an annealing. An acceptable alternative has one nitridation step. In this method, one low pressure of between about 80 and 180 torr, and preferably 100 torr, is maintained for all steps. Another alternative method is to eliminate the oxidation step. The resulting dielectric will have a different nitridation profile which may be desirable. Either the two-step nitridation or the one-step nitridation may be used in this case.

Figure 4:
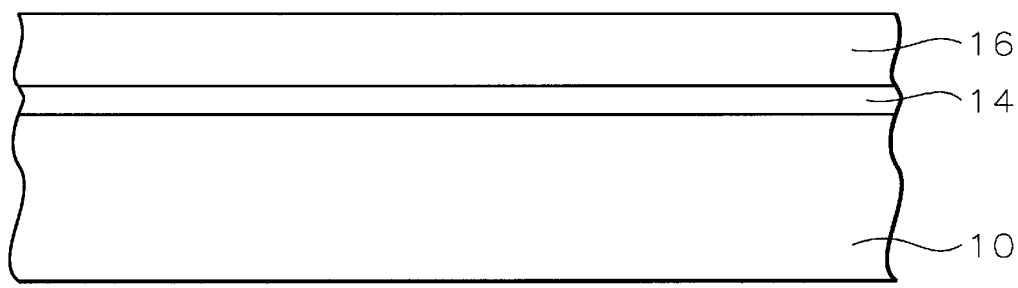

After the dielectric layer has been completed, temperature is ramped down and pressure released and the wafer is removed from the chamber. Referring now to FIG. 4, a polysilicon layer 16 is deposited over the dielectric layer 14, for example by low pressure chemical vapor deposition (LPCVD) typically to a thickness of between about 1500 and 2500 Angstroms.

Figure 5:
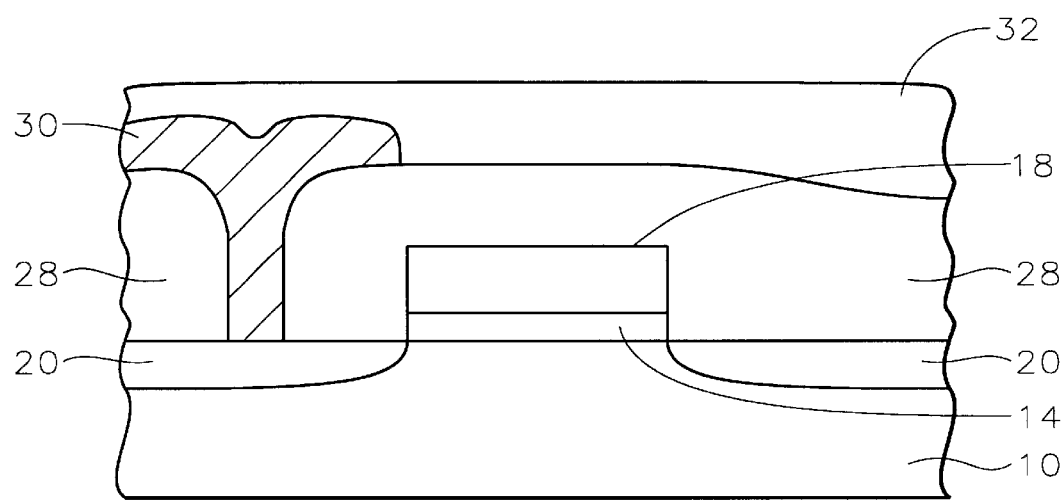

Next, the polysilicon and dielectric layers 16 and 14 are patterned and etched to provide gate electrodes, such as 18 shown in FIG. 5.

The integrated circuit device is completed as is conventional in the art. For example, as illustrated in FIG. 5, source and drain regions 20 are formed within the semiconductor substrate, typically by arsenic ion implant. An insulating layer 28 is blanket deposited over the surface of the substrate. Openings are etched through the insulating layer to underlying source and drain regions and other areas where electrical contact is to be made. A conducting layer 30 is deposited and patterned to complete the electrical connections. A passivation layer 32 completes the fabrication of the integrated circuit device.

The process of the invention provides an effective method of fabricating an integrated circuit device with improved gate oxide quality and resulting enhanced device performance.

EXAMPLE

The following example is given to show the important features of the invention and to aid in the understanding thereof. Variations may be made by those skilled in the art without departing from the spirit and scope of the invention.

Figure 6:
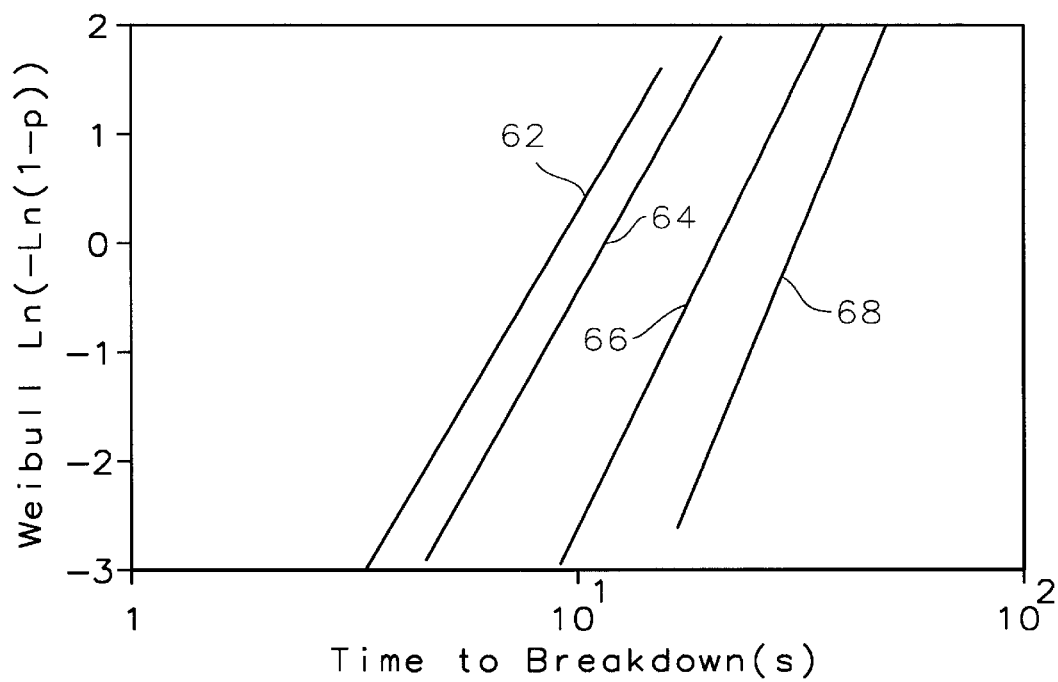
FIG. 6 graphically illustrates Weibull plots for time-to-breakdown of a polysilicon gate electrode having various dielectric layers.

The process of the invention also provides improved reliability in terms of charge-to-breakdown $Q_{bd}$. FIG. 6 shows Weibull plots for time to breakdown for a polysilicon gate electrode with differing gate dielectrics.

The following table describes the four different gate dielectrics tested. On FIG. 6, line 62 is the Weibull plot for Gate Dielectric 1, line 64 is the Weibull plot for Gate Dielectric 3, line 66 is the Weibull plot for Gate Dielectric 4, and line 68 is the Weibull plot for Gate Dielectric 2.

TABLE I

| Gate Dielectric | Pressure | Process Conditions | Thickness (Angstroms) | Standard Deviation |
|---|---|---|---|---|
| 1 | 740 torr | 1050 ° C., N$_2$O 30", N$_2$ 15" | 32 | 0.43 |
| 2 | 100 torr | 1050 ° C., N$_2$O 51", N$_2$ 15" | 31.5 | 0.22 |
| 3 | 740 torr | 1000 ° C., O$_2$ 30", N$_2$O 30", N$_2$ 15" | 31.4 | 0.32 |
| 4 | 100 torr | 1000 ° C., O$_2$ 40", N$_2$O 90", N$_2$ 15" | 31.7 | 0.21 |

Dielectrics 1 and 2 are formed by nitridation and annealing. Dielectric 2 is formed under the low pressure of the invention. Dielectrics 3 and 4 are formed by oxidation, nitridation, and annealing. Dielectric 4 is formed under the low pressure of the invention. It can be seen from the graph in FIG. 6 that the dielectrics 2 and 4, (lines 68 and 66, respsectively) formed under low pressure, have the best times to breakdown.

The process of the present invention uses low pressure of about 100 torr during nitridation to form a gate dielectric layer. Most preferably, the process includes oxidation, two nitridation steps, and annealing. A pressure of about 100 torr is maintained during the second nitridation step and a pressure of about 200 is maintained during the remaining steps. Preferably, the process includes two nitridation steps and annealing. A pressure of about 100 torr is maintained during the second nitridation step and a pressure of about 200 is maintained during the remaining steps. Alternatively, the process includes an optional oxidation step, one nitridation step, and annealing. A pressure of about 100 torr is maintained during all steps. The resulting gate dielectric layer has improved thickness uniformity and therefore is protected from boron penetration. The reliability of the dielectric layer in terms of charge to breakdown is improved over a dielectric layer formed at atmospheric pressure.

While the invention has been particularly shown and described with reference to the preferred embodiments thereof, it will be understood by those skilled in the art that various changes in form and details may be made without departing from the spirit and scope of the invention.

What is claimed is:

1. A method of forming a dielectric layer on a wafer in the fabrication of an integrated circuit device comprising:
    loading said wafer into a chamber wherein a pressure of less than atmospheric pressure is maintained during said forming of said dielectric layer;
    oxidizing the silicon substrate of said wafer for 15 to 60 seconds;
    thereafter nitriding said silicon substrate for 50 to 160 seconds; and
    thereafter annealing said silicon substrate for 20 to 60 seconds to complete formation of said dielectric layer in the fabrication of said integrated circuit device.

2. The method according to claim 1 wherein said pressure is maintained at between about 100 and 300 torr.

3. The method according to claim 1 wherein said pressure is maintained at about 100 torr.

4. The method according to claim 1 wherein said step of oxidizing said silicon substrate comprises flowing O$_2$ gas at the rate of 2 to 10 liters/minute at between about 900 and 1100° C.

5. The method according to claim 1 wherein said step of nitriding said silicon substrate comprises:
    flowing N$_2$O gas at the rate of 2 to 5 liters/minute at between about 900 and 1100° C. at a pressure of between about 100 and 300 torr; and
    thereafter flowing N$_2$O gas at the rate of 2 to 5 liters/minute at between about 900 and 1100° C. at a pressure of between about 80 and 180 torr.

6. The method according to claim 1 wherein said step of annealing said silicon substrate comprises flowing N$_2$ gas at 5 to 10 liters per minute at a temperature of between about 900 and 1100° C.

7. The method according to claim 1 wherein said dielectric layer has a thickness of between about 30 and 35 Angstroms.

8. A method of fabricating an integrated circuit device comprising:
    cleaning the silicon surface of a semiconductor wafer;
    loading said wafer into a chamber wherein a pressure of less than atmospheric pressure is maintained during forming of a dielectric layer;
    forming said dielectric layer according to the following steps:
        nitriding said silicon substrate; and
        thereafter annealing said silicon substrate wherein a pressure of between 80 and 180 torr is maintained during said steps of nitriding and annealing said silicon substrate;
    thereafter removing said wafer from said chamber;
    depositing a polysilicon layer overlying said dielectric layer;
    patterning said polysilicon layer and said dielectric layer to form a gate electrode;
    forming source and drain regions within said silicon substrate adjacent to said gate electrode;
    covering said gate electrode with an insulating layer;

etching an opening through said insulating layer to one of said source and drain regions;

depositing a conducting layer within said opening; and patterning said conducting layer to complete said fabrication of said integrated circuit device.

9. The method according to claim 8 wherein said pressure is maintained at between about 80 and 300 torr.

10. The method according to claim 8 wherein said pressure is maintained at about 100 torr.

11. The method according to claim 8 further comprising oxidizing said silicon substrate before said step of nitriding said silicon substrate wherein said oxidizing comprises flowing $O_2$ gas at the rate of 2 to 10 liters/minute at between about 900 and 1100° C. for between about 15 and 60 seconds.

12. The method according to claim 8 wherein said step of nitriding said silicon substrate comprises:

flowing $N_2O$ gas at the rate of 2 to 5 liters/minute at between about 900 and 1100° C. at a pressure of between about 100 and 300 torr for between about 20 and 60 seconds; and thereafter flowing $N_2O$ gas at the rate of 2 to 5 liters/minute at between about 900 and 1100° C. at a pressure of between about 80 and 180 torr for between about 60 and 100 seconds.

13. The method according to claim 8 wherein said step of nitriding said silicon substrate comprises flowing $N_2O$ gas at the rate of 2 to 5 liters/minute at between about 900 and 1100° C. for between about 60 and 100 seconds.

14. The method according to claim 11 wherein said step of nitriding said silicon substrate comprises flowing $N_2O$ gas at the rate of 2 to 5 liters/minute at between about 900 and 1100° C. for between about 60 and 100 seconds.

15. The method according to claim 8 wherein said step of annealing said silicon substrate comprises flowing $N_2$ gas at 5 to 10 liters per minute at a temperature of between about 900 and 1100° C. for 20 to 60 seconds.

16. The method according to claim 8 wherein said dielectric layer has a thickness of between about 30 and 35 Angstroms.

17. A method of forming a dielectric layer on a wafer in the fabrication of an integrated circuit device comprising:

loading said wafer into a chamber wherein a pressure of between about 100 and 300 torr is maintained during said forming of said dielectric layer;

oxidizing the silicon substrate of said wafer;

thereafter nitriding said silicon substrate wherein a lower pressure is maintained during said step of nitriding than during said step of oxidizing; and thereafter annealing said silicon substrate to complete formation of said dielectric layer in the fabrication of said integrated circuit device.

18. The method according to claim 17 wherein said step of oxidizing said silicon substrate comprises flowing $O_2$ gas at the rate of 2 to 10 liters/minute at between about 900 and 1100° C. for between about 15 and 60 seconds.

19. The method according to claim 17 wherein said step of nitriding said silicon substrate comprises:

flowing $N_2O$ gas at the rate of 2 to 5 liters/minute at between about 900 and 1100° C. at a pressure of between about 100 and 200 torr for between about 20 and 60 seconds; and thereafter flowing $N_2O$ gas at the rate of 2 to 5 liters/minute at between about 900 and 1100° C. at a pressure of between about 80 and 180 torr for between about 60 and 100 seconds.

20. The method according to claim 17 wherein said dielectric layer has a thickness of between about 30 and 35 Angstroms.

* * * * *